United States Patent
Solomon et al.

(10) Patent No.: US 6,355,107 B1
(45) Date of Patent: Mar. 12, 2002

(54) COMPOUND GAS INJECTION SYSTEM

(75) Inventors: Glenn S. Solomon, Redwood City; David J. Miller, Belmont; Tetsuzo Ueda, Menlo Park, all of CA (US)

(73) Assignees: CBL Technologies, Inc., Redwood City, CA (US); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/675,313

(22) Filed: Sep. 29, 2000

Related U.S. Application Data

(62) Division of application No. 09/293,205, filed on Apr. 16, 1999, now Pat. No. 6,179,913.

(51) Int. Cl.$^7$ .................. C23C 14/00; C23C 16/00
(52) U.S. Cl. .................................... 118/726
(58) Field of Search .......................... 118/726

(56) References Cited

U.S. PATENT DOCUMENTS

| | | | | |
|---|---|---|---|---|
| 4,121,082 A | * | 10/1978 | Harrington | 219/76.16 |
| 4,990,374 A | * | 2/1991 | Keeley | 427/255.1 |
| 5,587,014 A | * | 12/1996 | Iyechika | 117/90 |
| 5,810,925 A | * | 9/1998 | Tadamoto | 117/90 |
| 5,814,239 A | * | 9/1998 | Kaneko | 216/63 |
| 5,849,088 A | * | 12/1998 | DeDontney | 118/715 |
| 5,980,632 A | * | 11/1999 | Iyechika | 117/90 |

OTHER PUBLICATIONS

English Language Abstract to Japanesen Published Patent Application 01–116013 Title: Gaseous Phase Chemical Reaction Apparatus, Inventor Otsuka Kenichi.

* cited by examiner

Primary Examiner—Richard Bueker
(74) Attorney, Agent, or Firm—JDI Patent; Joshua D. Isenberg

(57) ABSTRACT

A reaction assembly of a vapor-phase deposition system includes a reaction chamber leading to a gullet outlet, and a sheath leading to a sheath outlet. The gullet outlet and the sheath outlet at the distal end of the reaction assembly, the distal end including a compound nozzle. The reaction assembly generates a compound gas stream for projection from the compound nozzle towards a target substrate. The compound gas stream includes a reagent gas stream and a sheath gas stream, wherein the sheath gas stream at least partially envelopes the reagent gas stream. Methods for generating and delivering a compound gas stream, and for performing vapor-phase deposition, are also disclosed.

9 Claims, 8 Drawing Sheets

Arranging a Substrate within a Growth Tube — 50

Projecting a Stream of Gas Towards the Substrate — 52

Introducing NH₃ into the Growth tube — 54

*FIG. 5*

COMPOUND GAS INJECTION SYSTEM

RELATED APPLICATION INFORMATION

This application is a divisional application of the application Ser. No. 09/293,205, filed on Apr. 16, 1999 now U.S. Pat. No. 6,179,913. The above named applications is hereby incorporated by reference.

BACKGROUND OF THE INVENTION

1. Field of the Invention

The present invention relates to the field of vapor-phase deposition. This invention further relates to a gas delivery system for epitaxial growth on a substrate. The invention also relates to a reaction assembly for generation of a compound gas stream useful in hydride vapor-phase epitaxy. This invention still further relates to methods of delivering a reagent gas to a substrate for vapor-phase deposition.

2. Background of the Related Art

Hydride vapor-phase epitaxy (HVPE) remains an important technique for the epitaxial growth of various semiconductors, such as gallium nitride (GaN). In such a system, growth proceeds due to the high-temperature, vapor-phase reaction between the gallium chloride (GaCl) and ammonia ($NH_3$). The ammonia is supplied from a standard gas source, while the GaCl is produced by passing hydrogen chloride (HCl) gas over a heated liquid gallium (Ga) supply heated from 750 to 850° C. The GaCl thus produced must be delivered to a substrate, typically through an assembly of tubes.

One major difficulty associated with prior art GaCl generation and transportation, e.g., in a HVPE system, is the unwanted deposition of solid GaCl on various components of the system. GaCl has a high vaporization temperature of more than 500° C., and will thus tend to deposit on any surface that is below this temperature. Such random deposition reduces the quantity of useful GaCl that is delivered to the substrate for reaction with ammonia, and thus reduces the amount of GaN available for epitaxial growth. In addition, deposits of GaCl tend to build up in the gas delivery system, eventually blocking efficient flow of reagents. Unwanted deposition is a particular problem in HVPE systems, where the epitaxial growth rates on the substrate are large, since large amounts of reagents must be transported within the system. As a result, frequent cleaning of the system is necessary to remove unwanted deposits. Cleaning and maintenance of HVPE systems and equipment components is a difficult, costly, time-consuming, and hazardous task. Moreover, where it is desired to deposit a thick layer of GaN on a substrate, unwanted deposition can reach problematic levels during the course of a single growth cycle, whereas cleaning and maintenance of the HVPE system can only be performed after a growth cycle is complete.

Prior art methods for avoiding deposition of GaCl in a HVPE system have involved heating all system components, e.g., tubes, lines, nozzles, to high temperatures. This complicates the design of the system, leading to operational problems and increased costs. In particular, the use of high temperatures to prevent GaCl deposition restricts the design and operation of the system, in that typically the GaCl must be produced in a chamber located very close to the substrate on which deposition is to take place.

Another drawback associated with prior art HVPE systems and methods is that the source or reagent gases often react prematurely, i.e., before reaching the substrate. For example, GaCl and ammonia tend to combine to form GaN on surfaces other than the substrate. Such premature deposition not only decreases the growth rate of the epitaxial layer, but also leads to unwanted deposition of GaN, e.g., on the walls of the reactor or growth chamber. Deposition of unwanted GaN can lead to clogging of the system, and also limits the distance between the GaCl production chamber and the substrate. Prior art attempts at avoiding premature, or non-target, deposition have focused on maintaining the Ga well below the reaction temperature of 1000–1100° C. However, this is difficult, especially since it must be done together with heating above the GaCl evaporation temperature.

The present invention overcomes problems associated with premature or non-target deposition of both reagent (e.g., GaCl) and reaction product (e.g., GaN) in prior art vapor-phase chemical deposition systems and methods.

SUMMARY OF THE INVENTION

In view of the above, it is an object of the present invention to provide a method of generating a gas stream for vapor-phase deposition.

One feature of the invention is that it provides a method for generating a compound gas stream for projection towards a substrate in an epitaxy system.

Another feature of the invention is that it provides a reaction assembly having a gullet outlet and a sheath outlet.

Another feature of the invention is that it provides a stream of sheath gas which prevents premature deposition of reagent gas in a vapor-phase deposition system.

Another feature of the invention is that it provides a stream of sheath gas which prevents premature reaction of reagent gases during vapor-phase deposition.

Another feature of the invention is that it provides a method for promoting efficient use of reagent gases for epitaxial growth in a HVPE system.

One advantage of the invention is that it provides a HVPE system which prevents non-target deposition during hydride vapor-phase epitaxy.

Another advantage of the invention is that it provides a reaction assembly having a gullet outlet at least partially encircled by a sheath outlet.

Another advantage of the invention is that it provides a reaction assembly for generating a compound gas stream.

Another advantage of the invention is that it provides a compound gas stream having a sheath gas enveloping a reagent gas.

Another advantage of the invention is that it provides a method for generating a compound gas stream having an enveloping sheath gas and an envelope reagent gas.

Another advantage of the invention is that it provides a method for introducing a compound sheath gas of an inert carrier gas and a corrosive etching gas such as HCl. The corrosive etching gas affects growth rates for nitride films that are deposited and can lead to highly uniform films with a high degree of crystalline character. A second advantage to introducing a corrosive etching gas in combination with of an inert carrier gas is that the etching gas prevent build-up of nitride deposition at or near the ejecting portion of the reaction assembly and thus reduces the maintenance associated with cleaning the deposition equipment.

These and other objects, advantages and features are accomplished by the provision of a method of vapor-phase deposition on a substrate within a growth chamber, the method including: a) providing a deposition system including a growth chamber; b) arranging the substrate within the growth chamber; and c) introducing a stream of reagent gas into the growth chamber, wherein the stream of reagent gas is at least partially enveloped within a stream of sheath gas.

These and other objects, advantages and features are accomplished by the provision of a method of generating a compound gas stream, including the steps of: a) providing a reaction assembly, the reaction assembly including a sheath, a reaction chamber located within the sheath, a sheath inlet leading to the sheath, a gullet inlet leading to the reaction chamber, a sheath outlet leading from the sheath, and a gullet outlet leading from the reaction chamber; b) projecting a reagent gas from the gullet outlet; and c) concurrently with step b), projecting a sheath gas from the sheath outlet.

These and other objects, advantages and features are accomplished by the provision of a system for vapor-phase deposition of a material on a substrate, wherein the system includes: a growth chamber including a growth chamber inlet, the growth chamber adapted for housing the substrate; and a reaction assembly including a sheath, a reaction chamber located within the sheath, a sheath inlet leading to the sheath, a gullet inlet leading to the reaction chamber, a sheath outlet leading from the sheath, and a gullet outlet leading from the reaction chamber.

These and other objects, advantages and features of the invention will be set forth in part in the description which follows and in part will become apparent to those having ordinary skill in the art upon examination of the following or may be learned from practice of the invention. The advantages of the invention may be realized and attained as particularly pointed out in the appended claims.

BRIEF DESCRIPTION OF THE DRAWINGS

FIG. 5 schematically represents a method for delivering a reagent gas to a substrate, according to another embodiment of the invention;

DETAILED DESCRIPTION OF THE PREFERRED EMBODIMENTS

For purposes of illustration, the invention will be described primarily in relation to a horizontal HVPE system for the deposition of GaN or similar material. However, the invention is also applicable to other vapor-phase deposition systems, including a vertical HVPE system, and to the deposition of materials other than gallium nitride.

Figure 1:
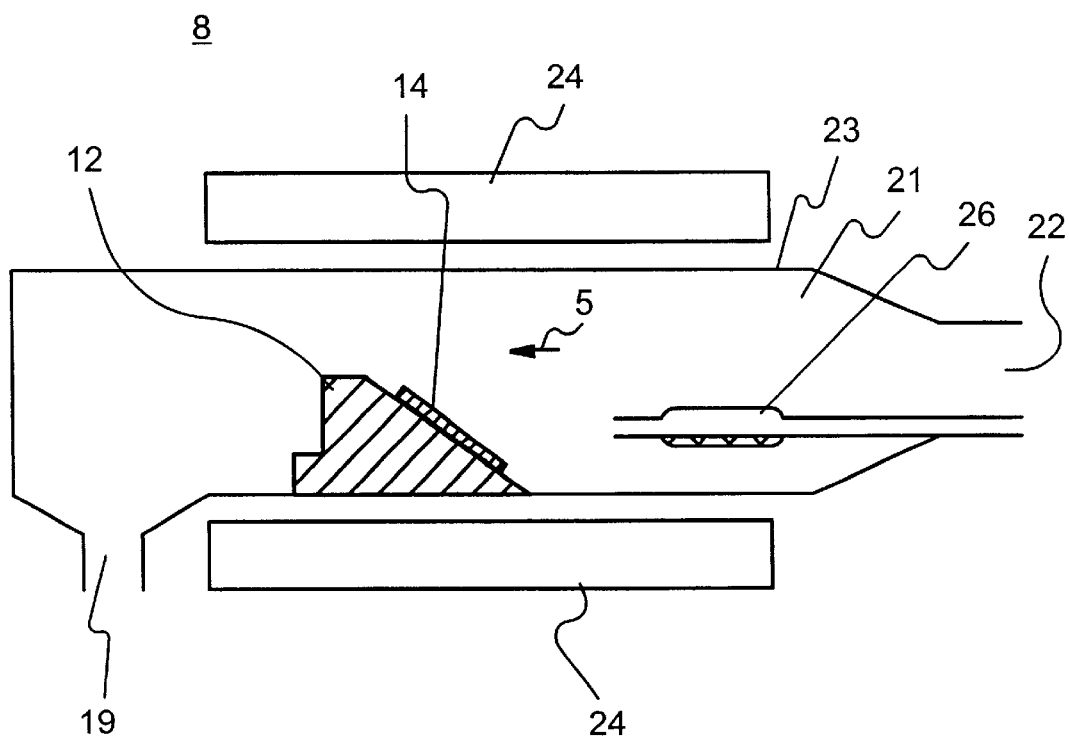
FIG. 1 schematically represents a HVPE system including a prior art reaction assembly, according to the prior art.

Referring now to the drawings, FIG. 1 schematically represents a HVPE system 8, according to the prior art, wherein system 8 includes a prior art reaction assembly 26. System 8 further includes a reactor or growth chamber 21, having a growth chamber inlet 22, and a growth chamber outlet 19. Reaction assembly 26 includes an inlet, a reagent gas production chamber, and an outlet (none of which are shown) Precursor gas is introduced into the production chamber of assembly 26. Reagent gas produced in the production chamber emanates from the outlet of assembly 26 and is directed towards a substrate 14 disposed within growth chamber 21.

System 8 may be contained entirely within a furnace 24. Epitaxial deposition proceeds by the vapor-phase reaction of source or reagent gases which are introduced into reactor 21. A reagent gas such as GaCl may be projected towards substrate 14 via reaction assembly 26, while ammonia may be introduced into growth chamber 21 through growth chamber inlet 22. The direction of gas flow is indicated by arrow 5. Reagent gases, are preferably mono-chloride of GaCl, InCl, of AlCl that react with ammonia within growth chamber 21 to form the respective nitride: GaN, InN, or AlN, but the reagent gases are also tri-chlorides of gallium, indium and aluminum. A portion of these reaction products is deposited on the target substrate. A further portion of the reaction products is deposited, together with reagent gas, on non-target surfaces (e.g., wall 23 of chamber 21), as was described hereinabove.

Figure 2:
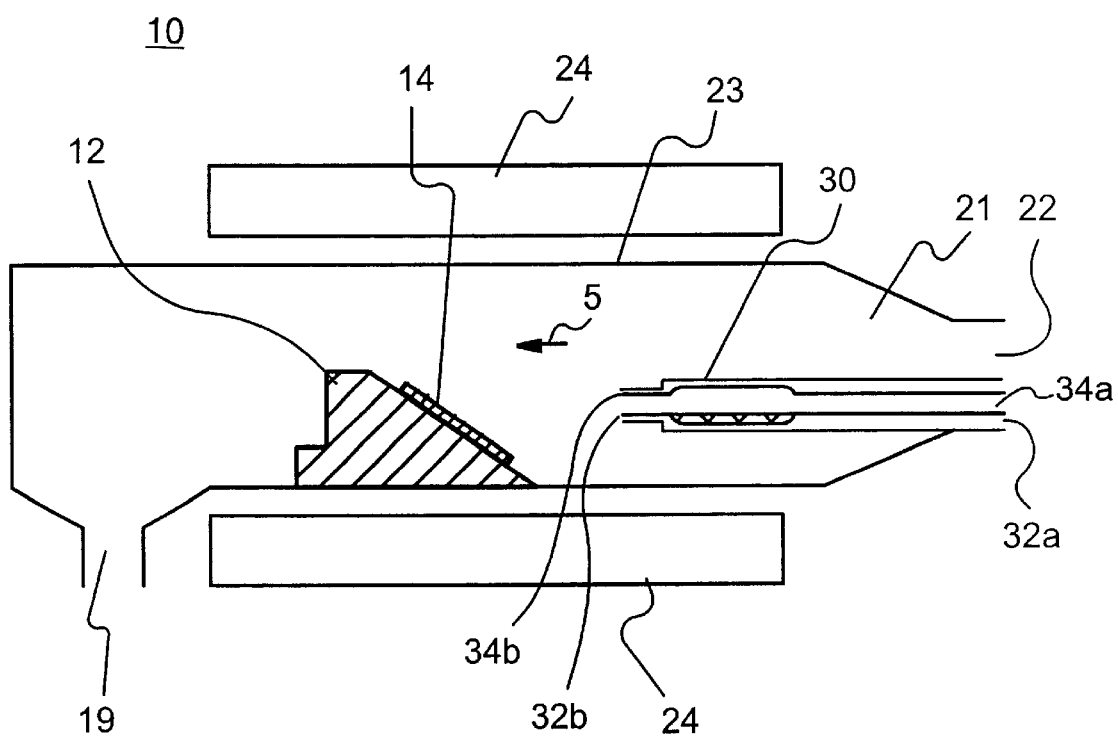
FIG. 2 schematically represents a HVPE system including a reaction assembly, according to the invention.

FIG. 2 schematically represents a HVPE system 10 including a reaction assembly 30, according to the invention. System 10 may be contained entirely within a two-zone furnace 24, (although a single-zone furnace could just as well be used). Inside furnace 24 is a growth chamber 21, typically made of quartz. Growth chamber 21 contains a heated substrate 14, on which epitaxial deposition of GaN proceeds by the vapor-phase reaction between GaCl and $NH_3$. Ammonia gas is supplied directly through inlet 22 of growth chamber 21, e.g. from a standard gas source. GaCl, on the other hand, is produced within reaction assembly 30. The direction of reagent gas flow is indicated by arrow 5.

Figure 3A:
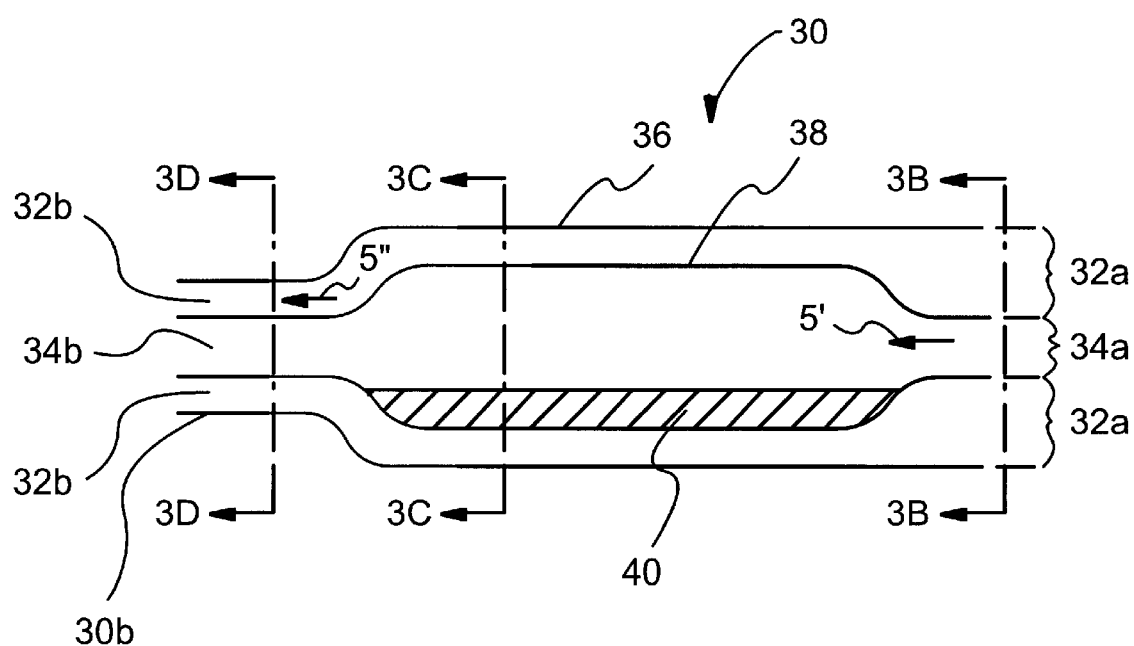
FIG. 3A shows a side view of a reaction assembly, according to one embodiment of the invention.

FIG. 3A shows a side view of reaction assembly 30, according to the invention. Reaction assembly 30 includes a sheath 36 having a sheath inlet 32a and a sheath outlet 32b, and a primary reaction chamber, or gullet, 38 having a gullet inlet 34a and a gullet outlet 34b. Primary reaction chamber 38 may be surrounded or enveloped by sheath 36.

Primary reaction chamber 38, gullet inlet 34a, and gullet outlet 34b may be constructed, for example, from quartz. Primary reaction chamber 38, gullet inlet 34a, and gullet outlet 34b preferably have a diameter in the range of 10–25, 6–13, 5–15 millimeter, respectively. More preferably, primary reaction chamber 38 has a diameter of about 15–30 mm, while gullet outlet 34b has a diameter of about 10–20 mm. Sheath 36 is preferably constructed from quartz; and preferably has a diameter in the range of from about 20 to about 30 millimeter.

Reaction assembly 30 includes a proximal end 30a and a distal end 30b. Preferably the proximal end 30a is sealed and engaged against growth chamber inlet 22 wherein a significant portion of the reaction assembly 30 is encased within the growth chamber or it may also be sealed and engaged at the distal end 30b against the growth chamber inlet (not shown), wherein the reaction assembly 30 is substantially outside of the growth chamber. Preferably, gullet outlet 34b is at least partially encircled by sheath outlet 32b. More preferably, gullet outlet 34b is completely encircled by sheath outlet 32b. According to a currently most preferred embodiment, gullet outlet 34b is coaxial with sheath outlet 32b. Together, gullet outlet 34b and sheath outlet 32b comprise a compound nozzle 33 (FIG. 3D) capable of projecting a compound gas stream towards a target substrate (e.g. substrate 14), as will be described hereinbelow.

In use, reaction chamber 38 contains a reactant 40, such as a metal of group III of the periodic table. More preferably, chamber 38 contains molten gallium, indium, or aluminum. According to a currently preferred embodiment of the invention, chamber 38 contains liquid gallium. The metal, e.g., Ga, may be introduced into reaction chamber 38 via gullet outlet 34b of assembly 30, and subsequently the metal in reaction chamber 38 may be heated. The temperature of the liquid Ga in chamber 38 is preferably in the range of from about 750° C. to about 900° C. and more preferably at a temperature of about 800° C.

Figure 4A:
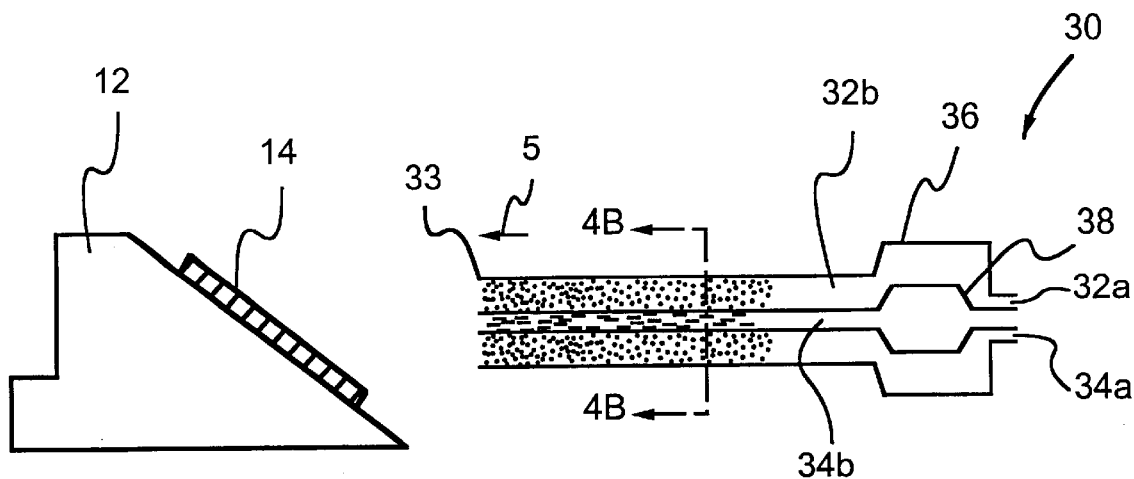
FIG. 4A schematically represents the projection of a compound gas stream from a reaction assembly towards a substrate, according to the invention.
Figure 4B:
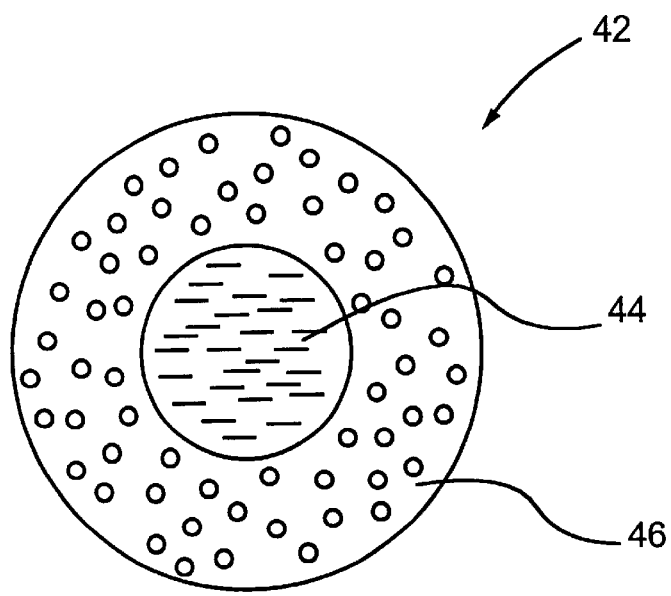
FIG. 4B is a cross-sectional view of a compound gas stream taken along the line 4B—4B of FIG. 4A.

A regulated flow of precursor gas, e.g., HCl, is introduced into chamber 38. The direction of precursor gas flow is indicated by arrow 5'. The HCl passes over the liquid Ga to form GaCl. (Hydrogen is formed as a by-product of the reaction.) A stream of GaCl is projected from gullet outlet 34b. At the same time, a substantially constant flow of carrier or sheath gas may be introduced into sheath 36 via sheath inlet 32a and the sheath gas projected from sheath outlet 32b. The sheath gas is preferably an inert gas selected from nitrogen, argon, helium or hydrogen. The sheath gas is also an inert gas mixed with HCl. HCl mixed with the sheath gas will etch the nitrides that are concurrently being deposited in the growth chamber and can greatly affect the morphology and degree of crystalline character of the resultant films. Arrow 5'' indicates the direction of sheath gas flow. As reagent gas (e.g., GaCl) flows from gullet outlet 32b it is enveloped by sheath gas flowing from sheath outlet 32b to form a compound gas stream (FIGS. 4A, 4B).

Figure 3B:
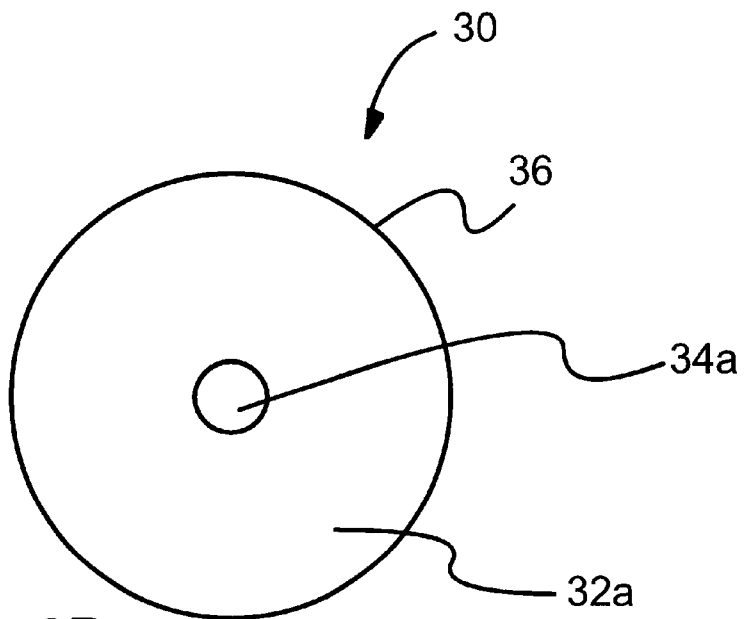
FIGS. 3B, 3C, and 3D are cross-sectional views of the reaction assembly of FIG. 3A taken along the lines 3B—3B, 3C—3C, and 3D—3D, respectively, according to the invention.

FIG. 3B shows a section of reaction assembly 30 taken along the line 3B—3B (FIG. 3A), including sheath 36, sheath inlet 32a, and gullet inlet 34a. Gullet inlet 34a is depicted in FIG. 3B as being encircled by sheath inlet 32a. However, other arrangements for sheath inlet 32a and gullet inlet 34a are possible under the invention. For example, a more or less co-linear arrangement of sheath inlet 32a, and gullet inlet 34a is possible.

Figure 3C:
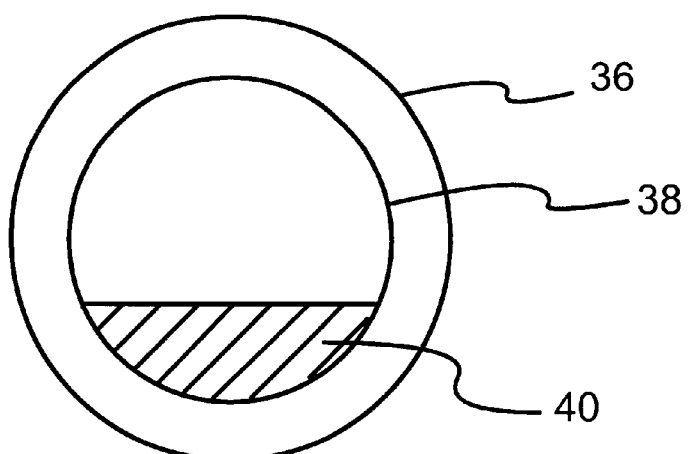

FIG. 3C shows a cross section of reaction assembly 30 of FIG. 3A taken along the line 3C—3C, according to the invention. Gullet or reaction chamber 38 serves as a reservoir, e.g. for a reactant 40 such as liquid gallium.

Reaction chamber 38 is depicted in FIG. 3C as being enveloped by sheath 36, however other arrangements are possible. For example, sheath 36 may be arranged adjacent, or substantially parallel, to reaction chamber 38.

Figure 3D:
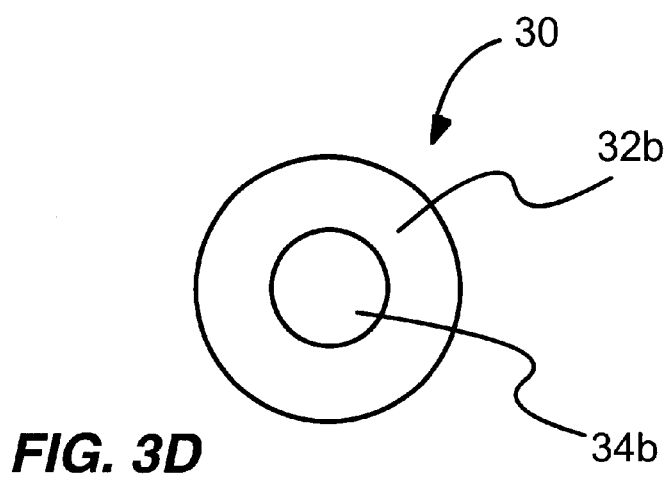

FIG. 3D is a cross-sectional view of reaction assembly 30 of FIG. 3A taken along the line 3D—3D, showing sheath outlet 32b and gullet outlet 34b. Sheath outlet 32b and gullet outlet 34b jointly comprise a compound nozzle 33. Compound nozzle 33 is adapted for projecting a compound gas stream 42 (FIGS. 4A–B).

Sheath outlet 32b is depicted in FIG. 3D as encircling gullet outlet 34b, however other arrangements are possible under the invention. For example, sheath 36 may extend into a substantially circular sheath outlet 32b which at least partially encircles gullet outlet 34b. According to a currently preferred embodiment of the invention, gullet outlet 34b is encircled by, and coaxial with, sheath outlet 32b.

FIG. 4A schematically represents the projection of a compound gas stream 42 from reaction assembly 30, according to the invention. Compound gas stream 42 projects from compound nozzle 33 towards substrate 14, the latter mounted on a susceptor 12. Compound gas stream 42 comprises a stream of reagent gas 44 emanating from gullet outlet 34b, and a stream of sheath or carrier gas 46 flowing from sheath outlet 32b. In compound gas stream 42, reagent gas 44 is at least partially enveloped by sheath gas 46.

FIG. 4B is a cross-sectional view of compound gas stream 42, taken along the line 4B—4B of FIG. 4A, and depicting reagent gas 44 as being completely enveloped by sheath gas 46. According to a currently preferred embodiment, reagent gas 44 flows substantially concentrically within sheath gas 46 towards substrate 14. When compound gas stream 42 approaches substrate 14, the presence of the hot substrate leads to turbulence which breaks the protective layer of sheath gas 46, allowing reagent gas 44 to react, e.g., with ammonia gas introduced into growth chamber 21 via growth chamber inlet 22.

According to one example of compound gas stream 42, reagent gas 44 includes GaCl and sheath gas 46 includes an inert gas such as nitrogen, argon, helium and hydrogen. When compound gas stream 42 experiences turbulence in the vicinity of substrate 14, concentric flow is disturbed allowing the GaCl to react with ammonia gas to form GaN. Before this point, however, the inert gas protects the GaCl, preventing unwanted deposition of GaCl, e.g., on wall 23 of growth chamber 21. This prevention of reagent gas deposition on system components is especially beneficial in the case of gullet outlet 34b, where deposits would otherwise tend to build up and eventually restrict flow of reagent gas from outlet 34b. A further advantage of reaction assembly 30 is that sheath gas 46 prevents reagent gas 44 (e.g., GaCl) from mixing with ammonia before reaching substrate 14, thereby avoiding premature production and deposition of GaN.

Again referring to FIG. 4B, the dual flow design of the gas delivery system of the current invention allows for introduction of a corrosive etching gas along with the inert sheath gas 46. The corrosive etching gas is preferably HCl, but may also be $HNO_3$, $H_2SO_4$, $NF_3$ and $SF_6$ or any number of etching gases known to etch metal nitrides. The corrosive etching gas in the sheath gas stream enhance can be controlled to cause different rates of etching of metal nitrides that are deposited on the substrate. Etching the metal-nitrite during deposition can greatly growth rates, and morphologies of the metal nitride produced. Further, the introduction of the corrosive etching gas in the sheath gas stream helps to prevent deposition of materials at the end of the gas delivery system from where the gas are injected into the growth chamber. Conventional systems do not provide a convenient method to introduce a corrosive etch gas at the high temperature region of the system to prevent build up.

FIG. 5 schematically represents a method for delivering a reagent gas to a substrate, according to another embodiment of the invention, in which step 50 involves arranging a substrate within a growth chamber of a vapor-phase deposition system. Step 52 involves projecting a stream of reagent gas towards the substrate. The reagent gas may include, e.g., a chloride of an element of group III of the periodic table, such as GaCl, InCl, AlCl $GaCl_3$, $InCl_3$, $AlCl_3$. The stream of reagent gas projected towards the substrate is at least partially enveloped within a stream of inert sheath (or carrier) gas or inert sheath gas/acid (HCl) mixture.

The stream of reagent gas and the stream of sheath gas together form a compound gas stream. The sheath gas includes an gas such as argon, nitrogen, helium and hydrogen or combination of inert gases. The sheath gas may serve as a conduit for the reagent gas as the latter is projected towards the heated substrate within the growth chamber. The sheath gas prevents deposition of the reagent gas as a solid, and prevents premature reaction of the reagent gas with other gases, e.g., ammonia (step 54). Step 54 involves introducing ammonia gas into the growth chamber of the vapor-phase deposition system. When the compound gas stream approaches the heated substrate, turbulence disrupts the sheath gas, thereby allowing the reagent gas to react with the ammonia gas.

Figure 6:
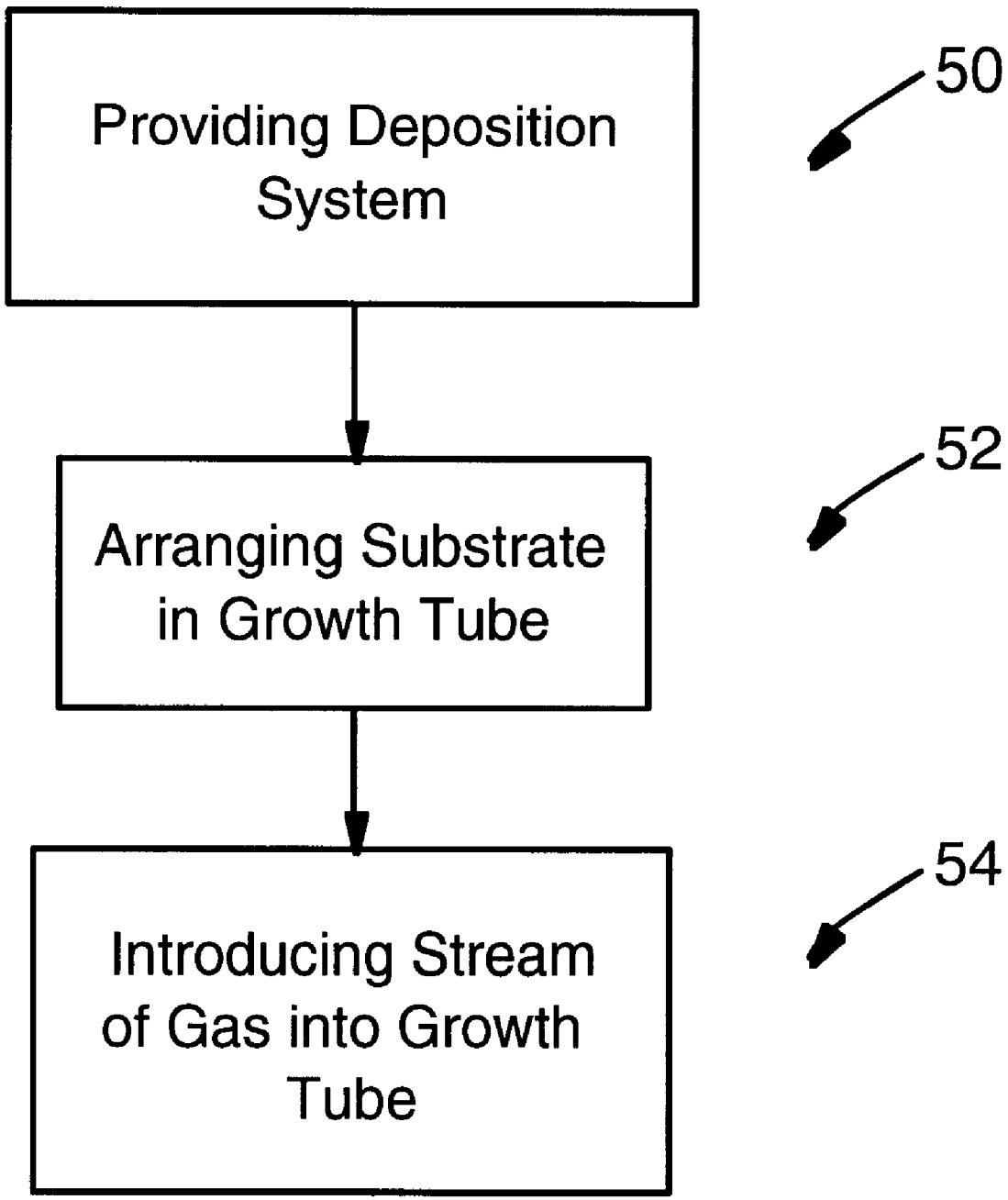
FIG. 6 schematically represents a series of steps involved in a method for vapor-phase deposition on a substrate, according to another embodiment of the invention.

FIG. 6 schematically represents a series of steps involved in a method for vapor-phase deposition on a substrate, according to another embodiment of the invention, in which step 60 involves providing a deposition system. The deposition system provided in step 60 includes a growth chamber and a reaction assembly, and may additionally include other elements or features as described hereinabove with reference to system 10 (FIG. 2). According to one embodiment, the deposition system provided in step 60 is a HVPE system for epitaxial deposition of, e.g., GaN or InN. Step 62 involves arranging a substrate within the growth chamber of the deposition system. The substrate is preferably sapphire or a sappire substrate with a buffer layer. Step 64 involves introducing a stream of reagent gas into the growth chamber via a compound nozzle of the reaction assembly. The reagent gas introduced into the growth chamber is at least partially enveloped by a sheath gas. The reagent gas and sheath gas together form a compound gas stream which is projected from the compound nozzle. The reagent gas is preferably GaCl, InCl, or AlCl, most preferably GaCl; while the sheath gas includes an inert gas, preferably nitrogen. The compound gas stream is projected towards the substrate. In the vicinity of the substrate, turbulence disrupts the integrity of the compound gas stream, allowing the reagent gas to react with ammonia gas, in turn leading to deposition on the substrate surface.

Figure 7:
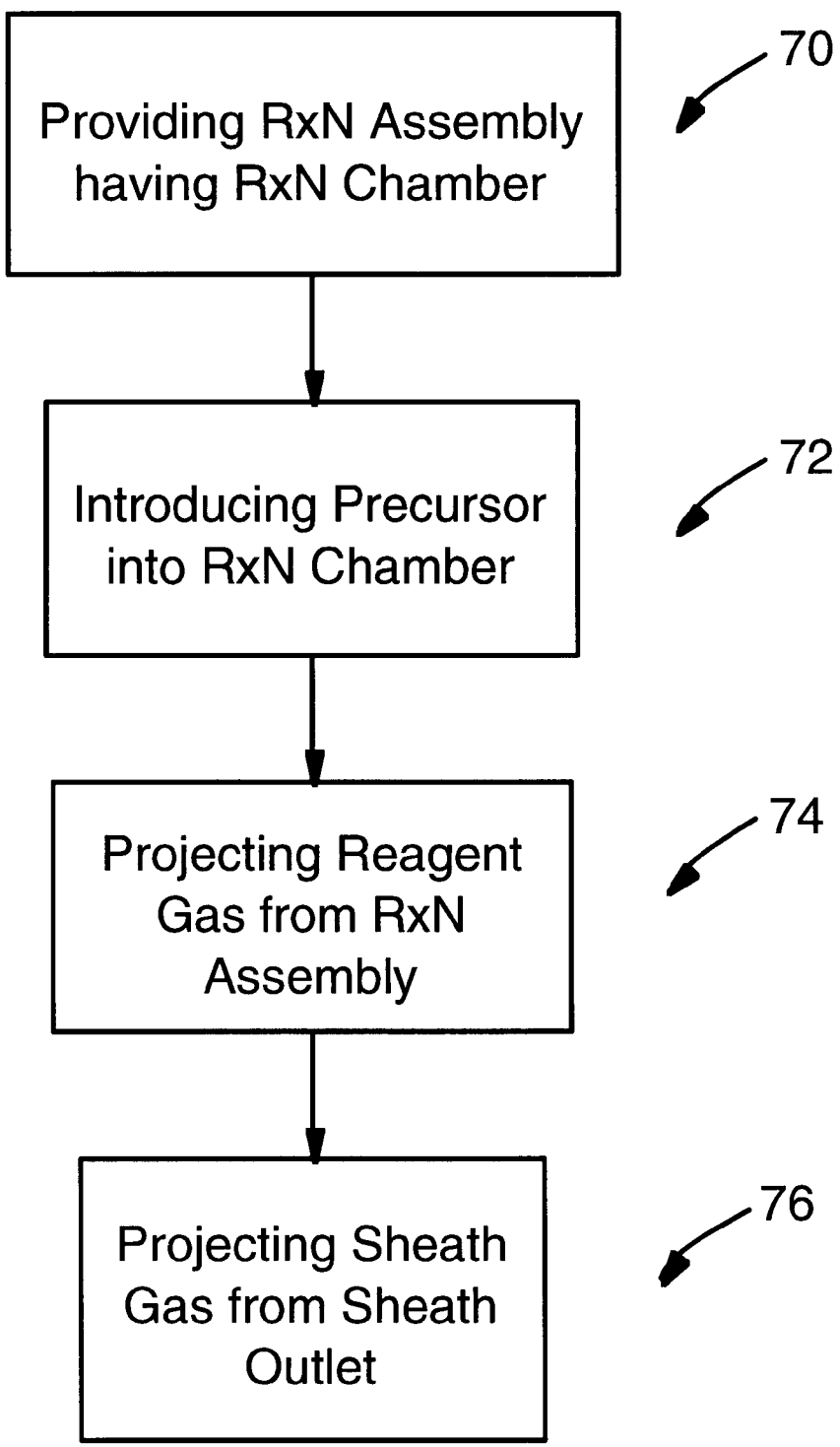
FIG. 7 schematically represents a series of steps involved in a method for generating a compound gas stream, according to another embodiment of the invention.

FIG. 7 schematically represents a series of steps involved in a method for generating a compound gas stream, according to another embodiment of the invention, in which step 70 involves providing a reaction assembly. The reaction assembly provided in step 70 includes a sheath, a reaction chamber located within the sheath, a sheath inlet leading to the sheath, a gullet inlet leading to the reaction chamber, a sheath outlet leading from the sheath, and a gullet outlet leading from the reaction chamber.

A metal element, such as one selected from the group consisting of Ga, In, and Al, is introduced into the reaction chamber, and heat is applied to provide a reservoir containing a molten metal. In the case of liquid Ga, the Ga is maintained at a temperature of about 800° C. A regulated flow of precursor gas, e.g., HCl, introduced into the reaction chamber via the gullet inlet, reacts with the molten metal to form the reagent gas (e.g., GaCl). The reagent gas is then projected from the gullet outlet in step 74. At the same time, a constant flow of sheath gas, e.g., nitrogen, is projected into the sheath of the reaction assembly and out of the sheath outlet, according to step 76. The sheath gas projected from the sheath outlet and the reagent gas projected from the gullet outlet together form a compound gas stream which is projected towards the substrate. The sheath gas of the compound gas stream at least partially encircles the reagent gas, thereby preventing premature deposition and reaction of the reagent gas.

In a preferred embodiment of the method of FIG. 7, the reagent gas is substantially concentric with the sheath gas within the compound gas stream until the reagent gas reaches the vicinity of the heated substrate. Thereafter, turbulence caused by the heated substrate causes disturbance of the sheath gas, and allows the reagent gas to mix with ammonia gas within the growth chamber.

The instant invention has been described with particular reference to deposition of nitrides such as gallium nitride by a horizontal HVPE system. However, the invention is also applicable to other materials and deposition processes, and reactor geometries. For example, the reaction assembly of the invention may equally find applications in a vertical HVPE system.

The foregoing embodiments are merely exemplary and are not to be construed as limiting the present invention. The present teaching may be applied to other types of apparatuses and methods. The description of the present invention is intended to be illustrative, and not to limit the scope of the appended claims. Many alternatives, modifications, and variations will be apparent to those skilled in the art.

What is claimed is:

1. A reaction assembly for generating a reagent gas, comprising:

a sheath, a reaction chamber adjacent said sheath, a sheath inlet leading to said sheath, a gullet inlet leading to said reaction chamber, a sheath outlet leading from said sheath, and a gullet outlet leading from said reaction chamber, wherein said reaction assembly is adapted for operating at temperatures in the range of from about 200° C. to about 1000° C., and said reaction chamber is adapted for containing molten metal at a temperature in the range of from about 400° C. to about 1000° C.

2. A system for vapor-phase deposition of a material on a substrate, comprising:

a) a growth chamber including a growth chamber inlet, said growth chamber adapted for housing the substrate; and b) a reaction assembly including a sheath, a reaction chamber adjacent said sheath, a sheath inlet leading to said sheath, a gullet inlet leading to said reaction chamber, a sheath outlet leading from said sheath, and a gullet outlet leading from said reaction chamber.

3. The system of claim 2, wherein said reaction assembly is adapted for providing a compound gas stream comprising a stream of reagent gas and a stream of sheath gas.

4. The system of claim 3, wherein the sheath gas at least partially envelopes the reagent gas.

5. The system of claim 2, wherein said sheath outlet encircles said gullet outlet.

6. The system of claim 2, wherein said sheath outlet is coaxial with said gullet outlet.

7. The system of claim 2, wherein said reaction assembly is disposed within said growth chamber.

8. The system of claim 2, wherein said reaction assembly includes a proximal end, said sheath inlet and said gullet inlet located at said proximal end, and said proximal end is sealed and engaged with said growth chamber inlet.

9. The system of claim 2, wherein said reaction assembly includes a distal end, said distal end including a compound nozzle.

* * * * *